United States Patent
Illegems

(10) Patent No.: US 9,739,809 B2
(45) Date of Patent: Aug. 22, 2017

(54) COMPLIANCE VOLTAGE DETECTOR CIRCUIT

(71) Applicant: CACTUS SEMICONDUCTOR, INC., Chandler, AZ (US)

(72) Inventor: Paul F. Illegems, Tucson, AZ (US)

(73) Assignee: CACTUS SEMICONDUCTOR, INC., Chandler, AZ (US)

( * ) Notice: Subject to any disclaimer, the term of this patent is extended or adjusted under 35 U.S.C. 154(b) by 7 days.

(21) Appl. No.: 15/017,378

(22) Filed: Feb. 5, 2016

(65) Prior Publication Data

US 2016/0231363 A1  Aug. 11, 2016

Related U.S. Application Data

(60) Provisional application No. 62/113,312, filed on Feb. 6, 2015.

(51) Int. Cl.
  *G01R 19/00* (2006.01)
  *G01R 19/165* (2006.01)

(52) U.S. Cl.
  CPC ....... *G01R 19/0084* (2013.01); *G01R 19/165* (2013.01); *G01R 19/16566* (2013.01)

(58) Field of Classification Search
  CPC .............. G01R 19/0084; G01R 19/165; G01R 19/16566; G01R 31/3662; G01R 27/2605; G01N 27/308; H01L 27/144
  USPC .. 324/724, 600, 452–453, 500, 514, 754.04, 324/691, 415–433, 421, 522–525, 549, 324/713, 76.11, 76.39–76.69, 76.77
  See application file for complete search history.

(56) References Cited

U.S. PATENT DOCUMENTS

| | | | |
|---|---|---|---|
| 6,181,969 B1 | 1/2001 | Gord | |
| 7,444,181 B2 | 10/2008 | Shi et al. | |
| 9,061,140 B2* | 6/2015 | Shi | A61N 1/025 |
| 9,336,731 B2* | 5/2016 | Long | G09G 3/344 |
| 2005/0077954 A1 | 4/2005 | Illegems | |
| 2007/0038250 A1 | 2/2007 | He et al. | |
| 2007/0296463 A1 | 12/2007 | Illegems et al. | |
| 2010/0176875 A1 | 7/2010 | Pulijala et al. | |
| 2012/0277822 A1 | 11/2012 | Trier | |
| 2013/0310894 A1 | 11/2013 | Trier | |
| 2014/0194947 A1 | 7/2014 | Parramon et al. | |
| 2015/0174417 A1 | 6/2015 | Ranu | |
| 2015/0290456 A1 | 10/2015 | Shi et al. | |

OTHER PUBLICATIONS

Cactus Semiconductor. CSI021 4-Channel High Voltage Programmable Current Sink/Source. 2 pp. Accessed Feb. 12, 2016 at http://www.implantable-device.com/wp-content/uploads/2013/03/Cactus-CSI021-v2.pdf?94fb22.

Cactus Semiconductor. CSI1021 Medical ASSP data sheet, V2014-8. 14 pp. Accessed Feb. 12, 2016 at http://www.cactussemiconductor.com/wp-content/uploads/2014/12/Cactus-Semiconductor-CSI1021-Medical-ASSP-Data-Sheet.pdf.

* cited by examiner

*Primary Examiner* — Melissa Koval
*Assistant Examiner* — Trung Nguyen
(74) *Attorney, Agent, or Firm* — Ballard Spahr LLP

(57) ABSTRACT

A system, method, and circuit to monitor a compliance voltage in an implantable stimulator device. An implantable medical device with a compliance voltage detector to monitor the voltage used by an output current source/sink circuit to ensure proper circuit performance while limiting power use.

20 Claims, 15 Drawing Sheets

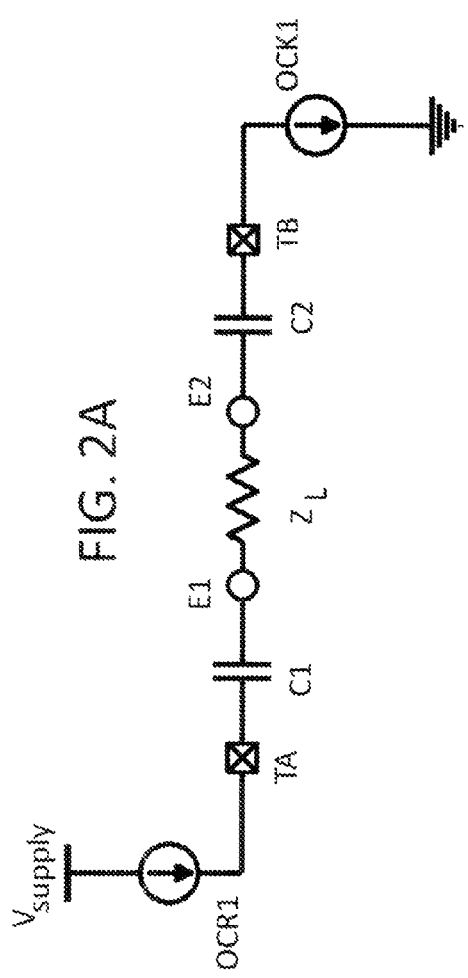
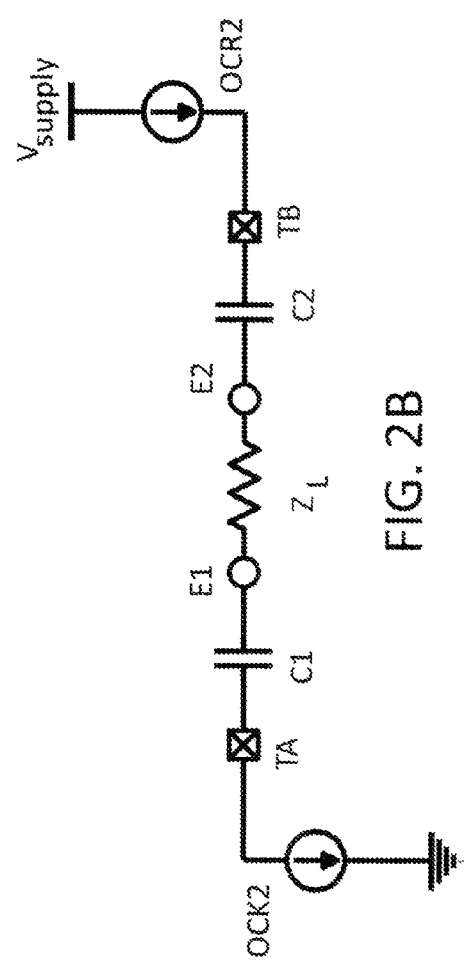
FIG. 2A
FIG. 2B

COMPLIANCE VOLTAGE DETECTOR CIRCUIT

RELATED APPLICATION

This application claims priority to U.S. Provisional Application No. 62/113,312, entitled "Compliance Voltage Detector Circuit" filed Feb. 6, 2015 and is hereby incorporated by reference in its entirety.

BACKGROUND

Field of the Disclosure

Aspects of the disclosure relate in general to tissue stimulation by an implantable device.

Description of the Related Art

Devices used to deliver electrical stimulation to body tissue (e.g., nerves and/or muscles) may be generally referred to as tissue stimulators. Particular examples of such devices for stimulating nerves and/or muscles include cardiac pacemakers, cardiac defibrillators, cochlear stimulators, spinal cord stimulators, retinal stimulators, and cortical stimulators. A tissue stimulator designed for implantation in the body may also be called an implanted pulse generator (IPG) and is typically battery-powered.

A tissue stimulator designed to deliver electrical stimulation to the brain, central and peripheral nervous system may also be called a neurostimulator. A neurostimulator may be a component of a surgically implanted system for deep brain stimulation, spinal cord stimulation, and/or vagus nerve stimulation. Such a system may be designed to treat neurological disorders and neuropathic pain.

Tissue stimulators (e.g., neurostimulators) may be designed for implantation within a person's body (e.g., surgically). Possible implantation sites, which may depend on the particular application, include beneath the clavicle and within the abdomen. The stimulator can be calibrated by a neurologist, nurse or trained technician to the individual patient's needs.

Implanted tissue stimulators are typically replaced periodically due to actual or expected battery failure. Battery life can be reasonably predicted by the use of a telemetry programming device so that the unit can be replaced prior to battery failure.

SUMMARY

An apparatus for monitoring electrode drive voltages according to a general configuration includes a first plurality of electrode terminal nodes, each configured to pass a corresponding source current to a corresponding one of a first plurality of electrodes, and a second plurality of electrode terminal nodes, each configured to receive a corresponding sink current from a corresponding one of a second plurality of electrodes. This apparatus also includes a plurality of first threshold detectors, each configured to produce a corresponding source compliance signal having (A) a first state when a voltage at a corresponding one of the first plurality of electrode terminal nodes is above a high-side threshold voltage and (B) a second state different than the first state when the voltage at the corresponding one of the first plurality of electrode terminal nodes is below the high-side threshold voltage, and a plurality of second threshold detectors, each configured to produce a corresponding sink compliance signal having (A) a first state when a voltage at a corresponding one of the second plurality of electrode terminal nodes is below a low-side threshold voltage and (B) a second state different than the first state when the voltage at the corresponding one of the second plurality of electrode terminal nodes is above the low-side threshold voltage. This apparatus also includes a coincidence indicator configured to indicate a coincidence in time of (A) the first state of at least one of the plurality of source compliance signals and (B) the first state of at least one of the plurality of sink compliance signals. In this apparatus, the low-side threshold voltage is between the high-side threshold voltage and a ground potential.

A method of monitoring electrode drive voltages according to a general configuration includes, at each of a first plurality of electrode terminal nodes, passing a corresponding source current to a corresponding one of a first plurality of electrodes and, at each of a second plurality of electrode terminal nodes, receiving a corresponding sink current from a corresponding one of a second plurality of electrodes. This method also includes, for each of the first plurality of electrode terminal nodes, producing a corresponding source compliance signal having (A) a first state when a voltage at the electrode terminal node is above a high-side threshold voltage and (B) a second state different than the first state when the voltage at the electrode terminal node is below the high-side threshold voltage and, for each of the second plurality of electrode terminal nodes, producing a corresponding sink compliance signal having (A) a first state when a voltage at the electrode terminal node is below a low-side threshold voltage and (B) a second state different than the first state when the voltage at the electrode terminal node is above the low-side threshold voltage. This method also includes indicating a coincidence in time of (A) the first state of at least one of the plurality of source compliance signals and (B) the first state of at least one of the plurality of sink compliance signals. In this method, the low-side threshold voltage is between the high-side threshold voltage and a ground potential.

BRIEF DESCRIPTION OF THE DRAWINGS

FIG. 2A shows a schematic diagram demonstrating an example of charge delivery, and FIG. 2B shows a schematic diagram demonstrating an example of charge delivery in the opposite direction.

DETAILED DESCRIPTION

Methods, apparatus, and circuitry as described herein may be used, for example, to monitor and adjust a compliance voltage in an implantable stimulator device. Such principles may be used, for example, to obtain an implantable medical device (e.g., a neurostimulator or other tissue stimulator) with a compliance voltage detector to adjust the voltage used by an output current source/sink circuit to ensure proper circuit performance while limiting power use.

Figure 1A:
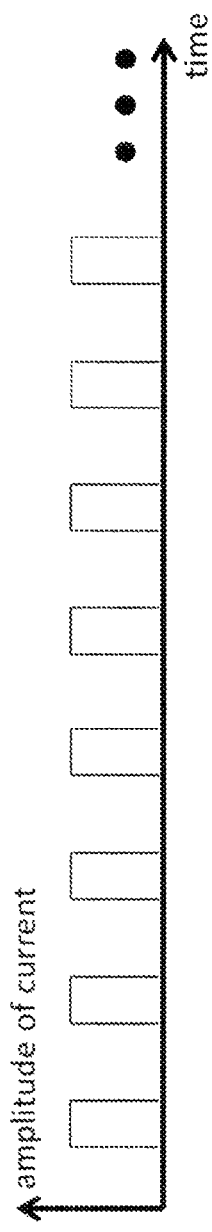
FIG. 1A shows an example of a monophasic mode of operation.
Figure 1B:
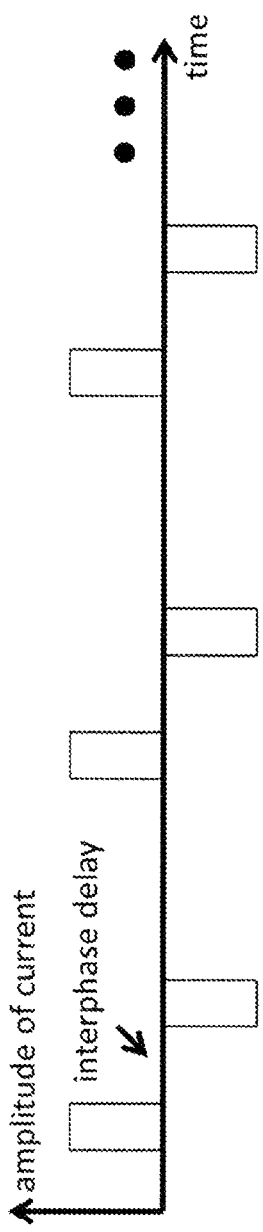
FIG. 1B shows an example of a biphasic mode of operation.
Figure 1C:
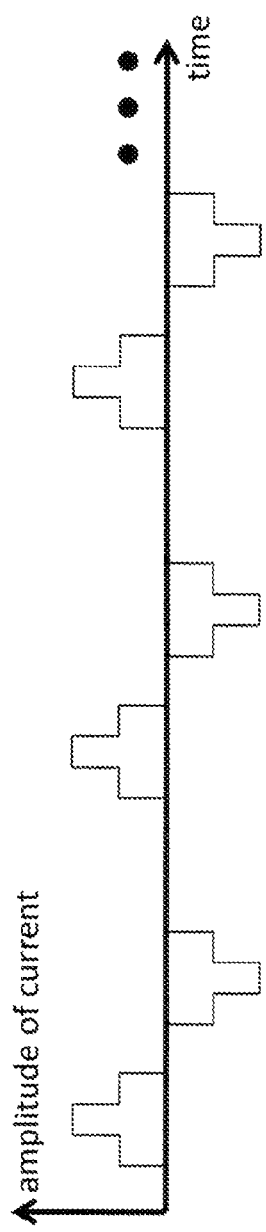
FIG. 1C shows an example of multiphasic operation.

A tissue stimulator may operate by delivering a desired amount of charge to a region of tissue into which electrodes have been implanted. FIG. 1A shows an example of a monophasic mode of operation, in which charge is delivered in a series of pulses of the same polarity. FIG. 1B shows an example of a biphasic mode of operation, which is more common. In biphasic operation, charge is delivered and removed in each pair of a series of pairs of pulses of opposite polarity, where the delivery and removal pulses in each pair are separated by an interphase delay. Biphasic operation is one example of multiphasic operation, in which the amplitude of the delivery pulse and/or of the removal pulse in each pair may be varied over time. FIG. 1C shows another example of multiphasic operation. In multiphasic operation, it is not necessary for the charge delivery and removal pulses in a pair to be symmetrical, although it is generally desired for the total amount of charge removed by the charge removal pulse to be equal to the amount of total amount of charge delivered by the charge delivery pulse.

Typically it is desired to drive the electrodes according to a predetermined charge delivery protocol rather than to perform arbitrary charge delivery. For example, it may be desired to deliver an intended amount of charge to the selected region of tissue in a given time period, and not appreciably more or less than this amount. It may also be desired to avoid charge accumulation in the tissue. To achieve the intended result in biphasic operation, for example, it may be desired for the quantities of charge in the charge delivery and charge removal pulses to be as intended. Typically, these pulses are designed to be a balanced pair, such that the charge removal pulse is designed to remove the charge delivered by the corresponding charge delivery pulse without removing any additional charge.

FIG. 2A shows a schematic diagram demonstrating an example of charge delivery. An output current source OCR1 is fed at a supply voltage Vsupply to source a desired current to an electrode terminal TA as a pulse. This charge delivery pulse passes through a blocking capacitor C1 to the electrode E1 and into the tissue. The pulse is drawn by an output current sink OCK1 to pass through the tissue along a path having an impedance ZL and to exit at the electrode E2. Output current sink OCK1, which is also powered at the supply voltage Vsupply, receives the pulse via another blocking capacitor C2 and electrode terminal TB. The total number of electrodes to be driven by a tissue stimulator in a typical implantation is typically on the order of ten (e.g., four, eight, ten, sixteen, or eighteen electrodes or more).

FIG. 2B shows a schematic diagram demonstrating an example of charge delivery to the same load and via the same electrodes in the opposite direction. In this case, an output current source OCR2 is fed at the supply voltage Vsupply to source a desired current to electrode terminal TB as a pulse. Output current sink OCK2, which is also powered at the supply voltage Vsupply, draws the pulse to electrode terminal TA via the same path in reverse. As a sequence, FIG. 2A and FIG. 2B show an example of biphasic operation using pulses of opposite polarity.

The blocking capacitors C1 and C2, which block direct current while allowing the pulses to pass, are typically implemented as discrete non-polarized capacitors (e.g., monolithic ceramic capacitors) that are external to the circuitry driving the electrode terminals TA and TB. In a typical implementation, each blocking capacitor C1, C2 has a capacitance on the order of one microfarad (e.g., 0.1, 0.22, 0.47, 0.68, 0.82, 1, 2.2, or 4.7 or more microfarads).

The amplitudes of the current pulses applied to the electrode terminals are typically in a range of from about two, five, ten, twenty, fifty, 100, or 200 microamperes to about one, two, four, five, or ten milliamperes or more, depending on the particular application. Typically the pulse amplitude is digitally selectable over such a range, with a step size of about two, five, ten, twenty, fifty, or one hundred microamperes. The durations of the current pulses applied to the electrode terminals are typically in a range of from about two, five, ten, or twenty microseconds to about 100, 200 or 500 or more microseconds. Typically the pulse duration is digitally selectable over such a range, with a step size of about two, five, ten, twenty, or fifty or more microseconds.

The interphase delay is typically on the order of the duration of each pulse and may also be selectable with a similar step size. The period of inactivity between each pair of pulses in a series of pulses is typically on the order of the total duration of a pair of corresponding pulses and may also be selectable with a similar step size. Series of pulses (e.g., each containing two, five, ten, or twenty pairs of pulses) may also be grouped over time, with a longer period of inactivity between each series (e.g., on the order of milliseconds, tens or hundreds of milliseconds, or even seconds or more).

A tissue stimulator may be implemented to include a dedicated output current source and output current sink for each electrode. Alternatively, a tissue stimulator may be implemented to include one or more output current source/sink pairs and a low-impedance switching matrix. The switching matrix may be arranged, for example, to selectably connect a source or a sink (or neither) to each electrode according to the configuration desired at any particular instant. In an intermediate example between these two alternatives, each of a first plurality of output current source/sink pairs is switchable among two or more corresponding electrodes of a first set of electrodes, and each of a second plurality of output current source/sink pairs is switchable among two or more corresponding electrodes of a second set of electrodes that is different than the first set.

Figure 3A:
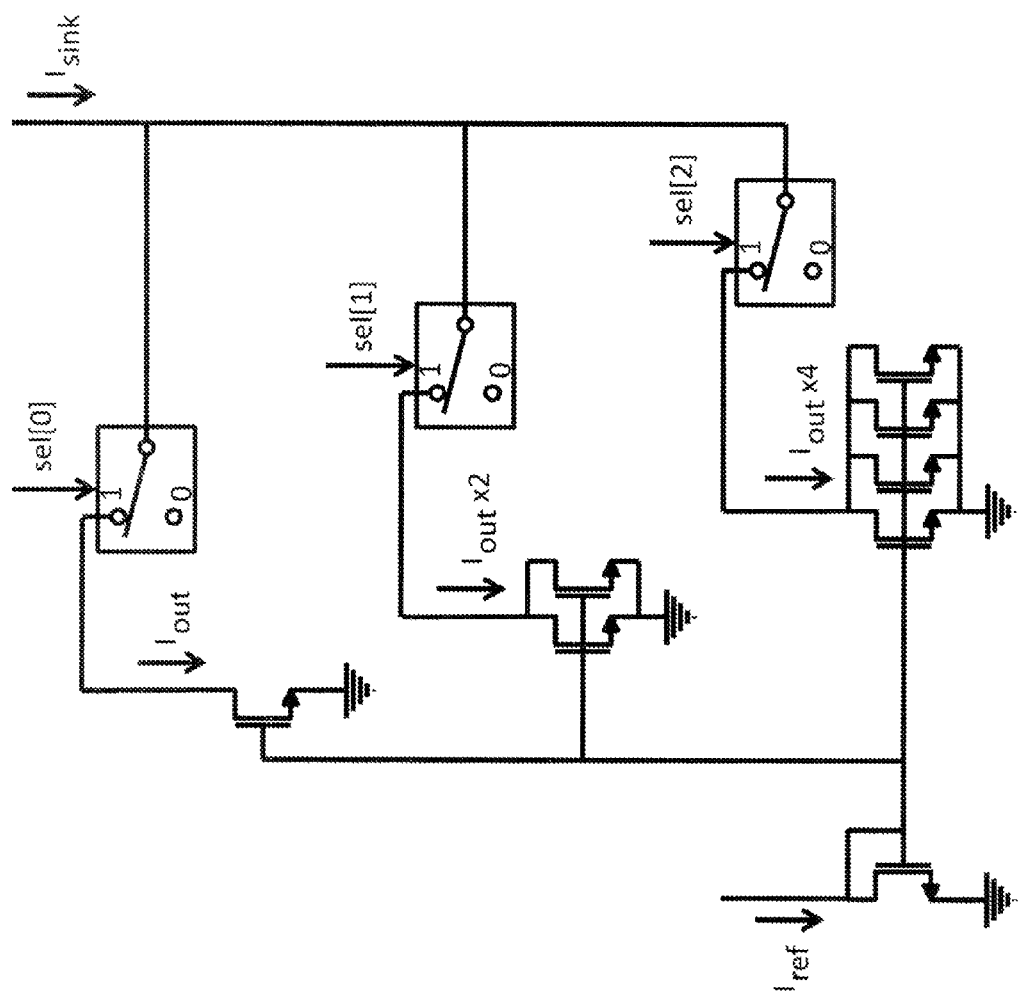
FIG. 3A shows an example of an implementation of an output current source as a digitally selectable set of component sources.
Figure 3B:
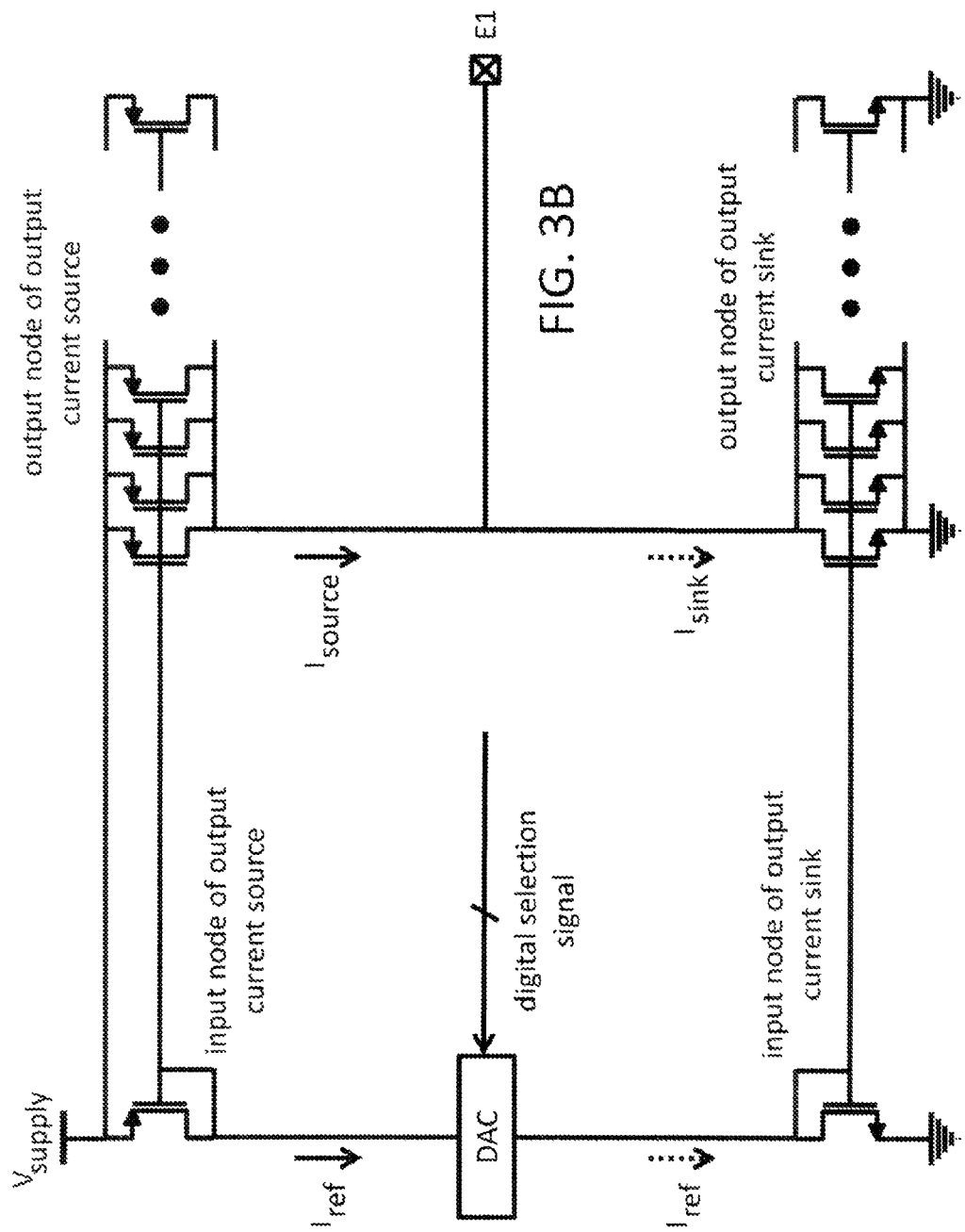
FIG. 3B shows an example of a circuit that includes an output current source and an output current sink.

In any of these cases, each output current source (sink) may be implemented as a digitally selectable set of component sources (sinks). FIG. 3A shows an example of such a set in which a three-bit digital value sel[2:0] is used to select a sink current Isink as any of the eight values (0, Iout, 2×Iout, . . . , 7×Iout). Implementation of an output current source according to the same principles will be recognized by one of ordinary skill in the art as fully disclosed herein, as will be the extension of such a source or sink to support selectability by an arbitrary number of bits (e.g., by including additional selectable component sources (sinks) of Iout× 8, Iout×16, etc.) and/or selectability of fractional values of Iout (e.g., by including additional selectable component sources (sinks) of Iout/2 and/or Iout/4). Many configurations of output current sources and sinks for tissue stimulation are known in the art, and the principles of apparatus A100 and method M100 as described herein are not limited to any particular configuration of output current sources and sinks. FIG. 3B shows another example in which an electrode terminal E1 is driven by a source current Isource, by a sink current Isink, or by no current at all, according to the value of a digital selection signal that controls a digital-to-analog converter DAC to provide a reference current Iref (whose amplitude is also selectable by the digital selection signal) to the input node of an output current source, to the input node of an output current sink, or to neither. (In the example shown, the reference current Iref is being provided to the input node of the source, such that source current Isource flows to the terminal E1.) For each of the output current source and output current sink (which source and sink may be replicated for each electrode terminal), the ratio of the size of the output node to the size of the input node (e.g., the ratio of the number of devices in the nodes) is typically on the order of fifty (e.g., ten, fifteen, twenty, twenty-five, fifty, one hundred, or more). When an electrode is not being used to source or sink current (e.g., between pulses), it is typically in a high-impedance state.

The supply voltage Vsupply that is required to enable the output current sources OCR1, OCR2 and output current sinks OCK1, OCK2 to deliver the desired amount of charge depends on the impedance of the path between electrodes E1 and E2, which may change over time. In practice, the electrodes in an implanted source/sink pair are typically separated by a distance of one to five millimeters. The impedance ZL of the path through the tissue between the pair of electrodes may be as high as one to five kiloohms and may also vary over time (due to, e.g., formation of scar tissue, movement of electrodes, changes in ion concentration, etc.). In order to reliably source and sink a desired range of pulse currents over such a range of path impedance, it may be desired to provide a supply voltage Vsupply of at least ten volts, up to twenty or twenty-five volts or even higher.

A tissue stimulator is typically powered by an internal rechargeable battery (although it is conceivable that the battery may be replaced or supplemented by one or more supercapacitors, as such technology continues to develop). Such a battery may contain, for example, one or more lithium-ion cells, each having a nominal voltage of 3.6 volts. It is generally desirable to maximize the period between recharges of the battery (or other power source), not only for convenience but also to extend the lifetime of the battery. To such end, it is generally desired to minimize the power consumption of the stimulator.

In order to achieve the supply voltage Vsupply used to power the output current sources and output current sinks, the stimulator may include a DC-to-DC converter (e.g., a boost converter). Because the efficiency of the converter typically decreases as its output voltage increases, it is generally desirable to keep the supply voltage Vsupply as low as possible in order to minimize power consumption. For example, it may be desired to control the converter's output voltage to be only as high as needed to ensure delivery of the intended amount of charge under the present path conditions.

A change in the path between the electrodes may cause the voltage between the electrodes to exceed the voltage between Vsupply and ground. Such a condition may be caused, for example, by an increase in the path impedance ZL. In another example, such a condition may arise from an accumulation of charge that remains in one or both of the blocking capacitors between pulse pairs (e.g., due to an imbalance between the charge delivery and charge removal pulses), causing a voltage to appear across the terminals of the capacitor. Under such an overvoltage condition, the output current source and output current sink may continue to source and sink current, respectively, but the magnitude of such current becomes indeterminate once the compliance voltage of the source and/or sink is exceeded.

One aspect of the disclosure is the realization that battery life is affected by current use. A compliance voltage is the maximum voltage that the current source can supply to a load. Over a given load range, it is possible for some types of current sources to exhibit extremely high internal resistance. However, when the current source reaches its compliance voltage, it abruptly stops being a current source.

In another aspect, a compliance voltage detector is used in a device which has several electrodes which supply current to nerves in the human body.

The currents supplied by the electrodes should be very well defined. However, the currents are generated by circuits with a limited supply voltage. If the impedance of the path from the sourcing to the sinking electrode (including the electrode wires, contacts and nerve tissue) becomes high, the voltage between the electrodes will increase and the headroom for the current sources will become too small. In that case the current will diminish and not be accurate any more.

Consider a pair of electrodes driving a current through a load Z, one sourcing and one sinking. The terminals of the electrode outputs are high-impedance nodes. This means that the voltage at these terminals can be anywhere, even outside the supply rails (higher than Vsupply or below GND). Usually there are parasitic or intended diodes to the supply rails causing the voltages not to exceed GND−Vfw or Vsupply+Vfw, where Vfw is the forward voltage drop of the diode.

A compliance voltage detector may be configured to look for the following non-compliance condition (assuming that one (or more) electrode(s) are sourcing current and at least one electrode is sinking current): when the voltage at (one of) the sourcing electrode(s) approaches the Vsupply rail and at the same time the voltage at (one of) the sinking electrode(s) approaches the GND rail, then non-compliance is detected.

Figure 4:
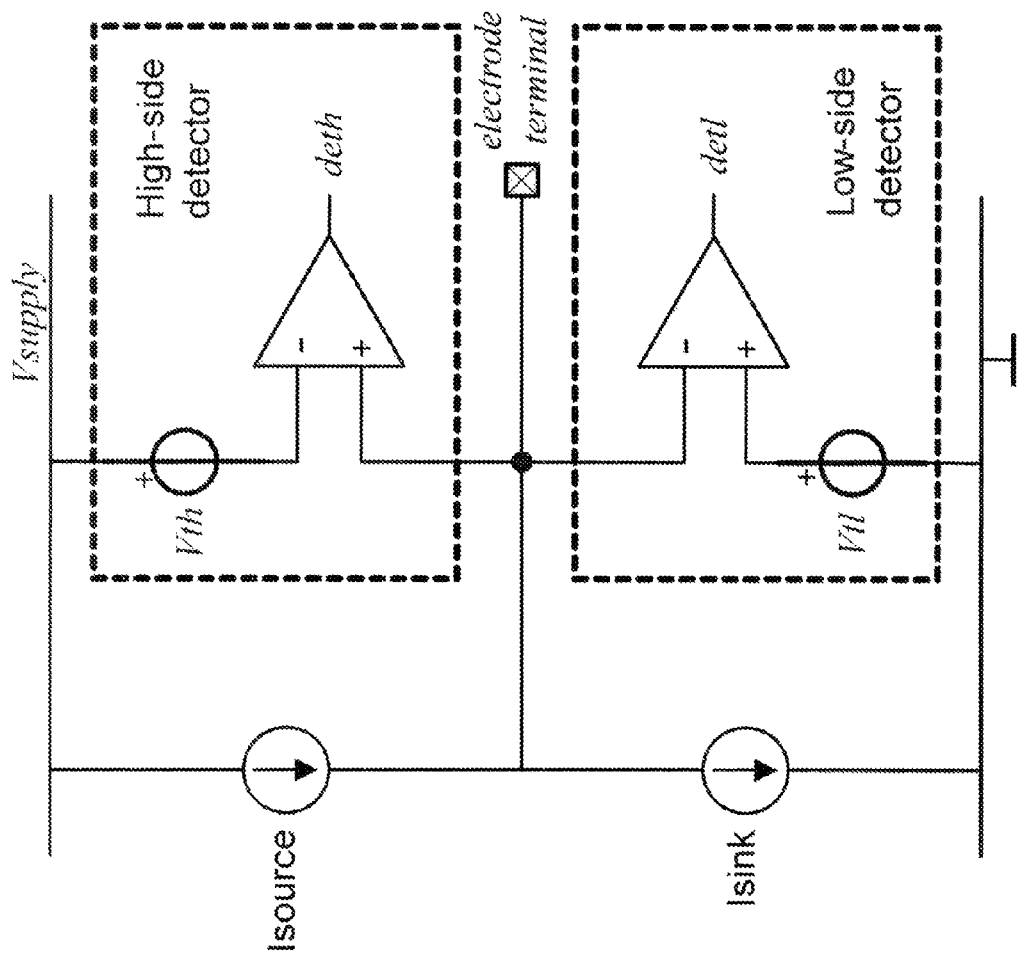
FIG. 4 depicts two detectors monitoring an electrode output.

FIG. 4 shows two detectors monitoring an electrode output (e.g., in a tissue stimulator, such as a neurostimulation device). Specifically, FIG. 4 shows an example of a circuit that is configured to monitor the voltage at an electrode terminal node and includes a high-side detector and a low-side detector. As described above, the electrode terminal node passes current sourced by output current source Isource, or receives current drawn by output current sink Isink. Both of the source Isource and the sink Isink may be off at the same time, and typically it is desired that no more than one among the source Isource and the sink Isink are on at the same time. The high-side detector produces a signal deth that has a first state when the electrode voltage exceeds a high-side threshold voltage Vth and a second state when the electrode voltage is less than Vth. The low-side detector produces a signal detl that has a first state when the electrode voltage is less than a low-side threshold voltage Vtl and a second state when the electrode voltage is higher than Vtl. The high-side threshold voltage Vth is less than but close to Vsupply (e.g., within one or two volts). Similarly, the low-side threshold voltage Vtl is above but close to ground (e.g., within one or two volts). The values of Vth and Vtl may be selected to provide a desired amount of headroom between (A) voltages that trigger an indication of non-compliance and (B) actual non-compliant operation. In this particular example, the high-side detector produces a high output when Velectrode is within Vth of the supply rail, and the low-side detector's output becomes high when the electrode voltage is less than Vtl.

Such detectors may be present at every electrode output of a system with multiple electrodes. The circuit of FIG. 9, for example, is one implementation of a circuit for indicating the non-compliance condition stated above. When any of the signals "deth" is high AND any of the signals "detl" is high, the output "non-compliant" becomes high. This indicates that at least one electrode is close to the Vsupply rail and at the same time (at least) one electrode is close to GND. This is sufficient to decide that the electrode current is at the verge of becoming inaccurate. The "non-compliant" signal can be used to increase Vsupply or to reduce the current and to indicate the fault condition.

Figure 5A:
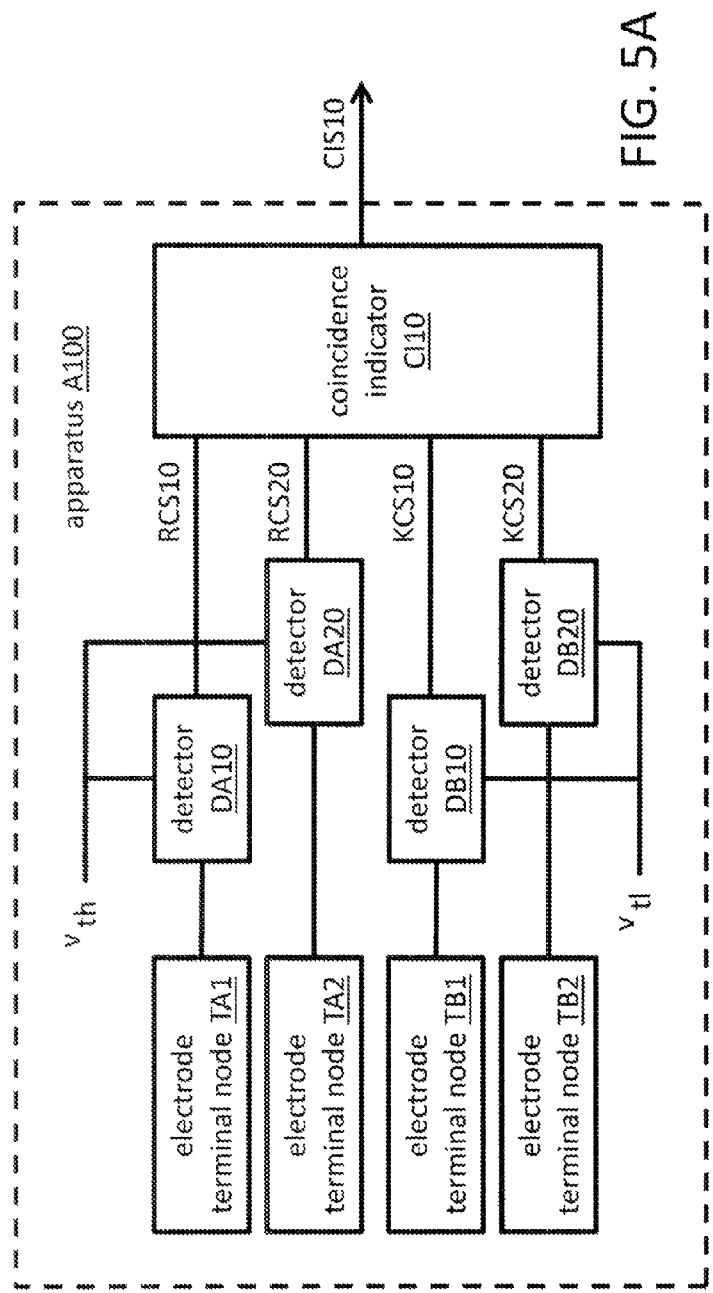
FIG. 5A shows a block diagram of an apparatus for monitoring electrode drive voltages A100 according to a general configuration.

FIG. 5A shows a block diagram of an apparatus for monitoring electrode drive voltages A100 according to a general configuration. Apparatus A100 includes a first plurality of electrode terminal nodes TA1 and TA2, each configured to pass current sourced by a corresponding output current source. The output current source may be the same for both of nodes TA1 and TA2, or each node may be driven by a different source. Apparatus A100 also includes a second plurality of electrode terminal nodes TB1 and TB2, each configured to receive current drawn by a corresponding output current sink. The output current sink may be the same for both of nodes TB1 and TB2, or each node may be driven by a different source. Each of the electrode terminal nodes is typically implemented as a contact pad of an integrated circuit that is conductively connected (e.g., via a wire bond) to a corresponding one of a set of electrode terminals. The electrode terminals are typically implemented as pins, pads, balls, leads, or other external connections of a package (e.g., a Quad Flatpack (QFP) package, a Quad Flatpack No-lead (QFN) package, etc.) that contains the integrated circuit which includes apparatus A100.

Apparatus A100 also includes a plurality of first threshold detectors DA10 and DA20 and a plurality of second threshold detectors DB10 and DB20. Each first threshold detector (e.g., DA10, DA20) is configured to produce a corresponding source compliance signal (e.g., RCS10, RCS20) having (A) a first state when a voltage at a corresponding one of the first plurality of electrode terminals is above the high-side threshold voltage Vth and (B) a second state different than the first state when the voltage at the corresponding one of the first plurality of electrode terminals is below Vth. Each second threshold detector (e.g., DB10, DB20) is configured to produce a corresponding sink compliance signal (e.g., KCS10, KCS20) having (A) a first state when a voltage at a corresponding one of the second plurality of electrode terminals is below the low-side threshold voltage Vtl and (B) a second state different than the first state when the voltage at the corresponding one of the second plurality of electrode terminals is above Vtl.

Figure 5B:
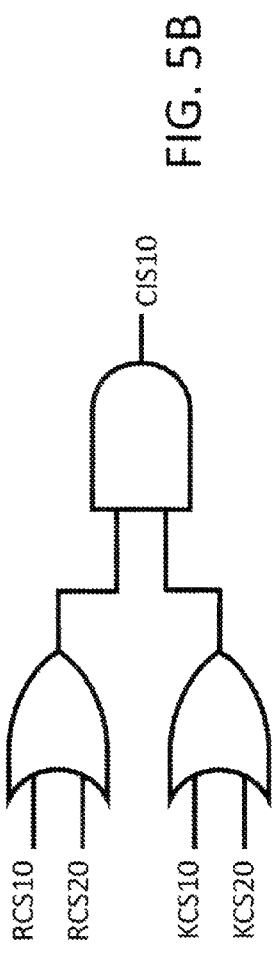
FIG. 5B shows a block diagram of an implementation of coincidence indicator CI10 in combinational logic.

Apparatus A100 also includes a coincidence indicator CI10 that is configured to indicate a coincidence in time of (A) the first state of at least one of the plurality of source compliance signals RCS10, RCS20 and (B) the first state of at least one of the plurality of sink compliance signals KCS10, KCS20. FIG. 5B shows a block diagram of an implementation of coincidence indicator CI10 as a combination of OR and AND logic for the example in which the first and second states of the source and sink compliance signals are indicated as 1 (HIGH, TRUE) and 0 (LOW, FALSE), respectively. One of ordinary skill will recognize that the architecture of apparatus A100 may be extended in the same manner to monitor an arbitrary number of sourcing electrode terminal nodes and an arbitrary number of sinking electrode terminal nodes.

Figure 6:
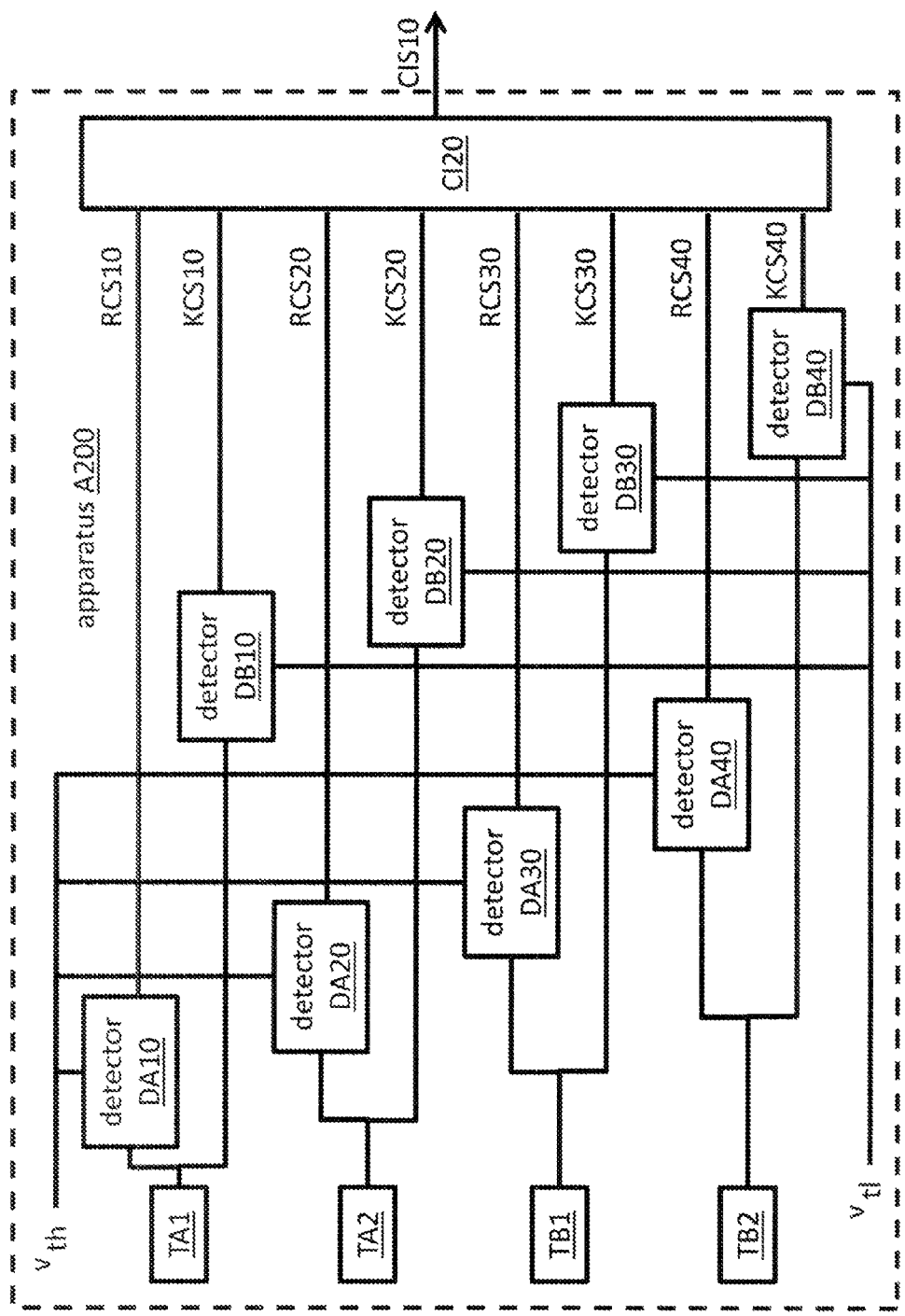
FIG. 6 shows a block diagram of an implementation A200 of apparatus A100.

As shown in FIG. 4, it may be desired to monitor the voltage at each electrode terminal for both high-side and low-side compliance. FIG. 6 shows a block diagram of such an implementation A200 of apparatus A100 that includes an instance of each of detectors DA10 (i.e., detectors DA10, DA20, DA30, and DA40) and DB10 (i.e., detectors DB10, DB20, DB30, and DB40) for each of the electrode terminal nodes. Apparatus A200 also includes an implementation CI20 of coincidence detector CI10 that may be implemented to produce signal CIS10 as, for example, the result of the logical operation (RCS10 OR RCS20 OR RCS30 OR RCS40) AND (KCS10 OR KCS20 OR KCS30 OR KCS40). In this example, the first and second states of the source and sink compliance signals are 1 and 0, respectively, as described above. One of ordinary skill will recognize that the architecture of apparatus A200 may be extended to monitor an arbitrary number of electrode terminal nodes in the same manner.

Figure 7B:
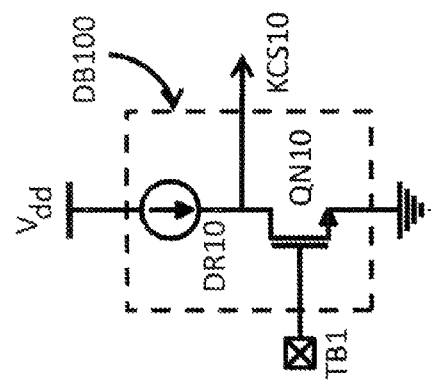
FIG. 7B shows a schematic diagram of an implementation DB100 of second threshold detector DB10.
Figure 7A:
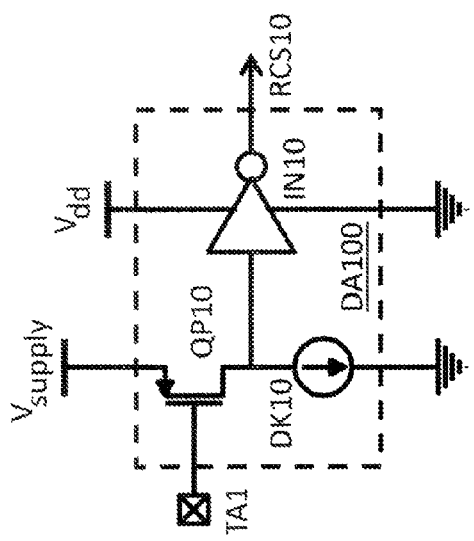
FIG. 7A shows a schematic diagram of an implementation DA100 of first threshold detector DA10.

FIG. 7A shows a schematic diagram of an implementation DA100 of first (high-side) threshold detector DA10 that includes a transistor QP1 and a detector current sink DK10. In one example, transistor QP1 is implemented as a p-channel MOSFET, and detector current sink DK10 is implemented to sink a current on the order of one hundred nanoamperes. When the source is compliant during a pulse, the voltage at the terminal node (e.g., the gate of QP10) is below Vth such that transistor QP10 is operating in the linear region and the voltage at the detector output (e.g., the drain of QP10) is high (i.e., close to Vsupply). If the source is non-compliant such that the voltage at the terminal node rises above Vth, transistor QP10 will turn off and the voltage at the drain will drop low (i.e., close to ground).

It may be desired to implement first detector DA10 to provide the output signal RCS10 as an active-high signal. Additionally or alternatively, it may be desired to provide detector output signal RCS10 in a logic domain, such that a high state corresponds to a logical high level rather than to Vsupply. In first detector DA100, the signal at the drain of QP10 is converted to an active-high logic-level output signal using an inverter IN10 (e.g., an NMOS or CMOS inverter) powered at a logic-level supply voltage Vdd that is lower than Vsupply (e.g., 1.8, 2.5, 3.3, or five volts above ground).

FIG. 7B shows a schematic diagram of an implementation DB100 of second (low-side) threshold detector DB10 that includes a transistor QN1 and a detector current source DR10. In one example, transistor QN1 is implemented as an n-channel MOSFET, and detector current source DR10 is implemented to source a current on the order of one hundred nanoamperes. When the sink is compliant during a pulse, the voltage at the terminal node (e.g., the gate of QN10) is above Vtl such that transistor QN10 is operating in the linear region and the voltage at the detector output (e.g., the drain of QN10) is low (i.e., close to ground). If the sink is non-compliant such that the voltage at the terminal node drops below Vtl, transistor QN10 will turn off and the voltage at the drain will rise high (i.e., close to Vdd).

Figure 7C:
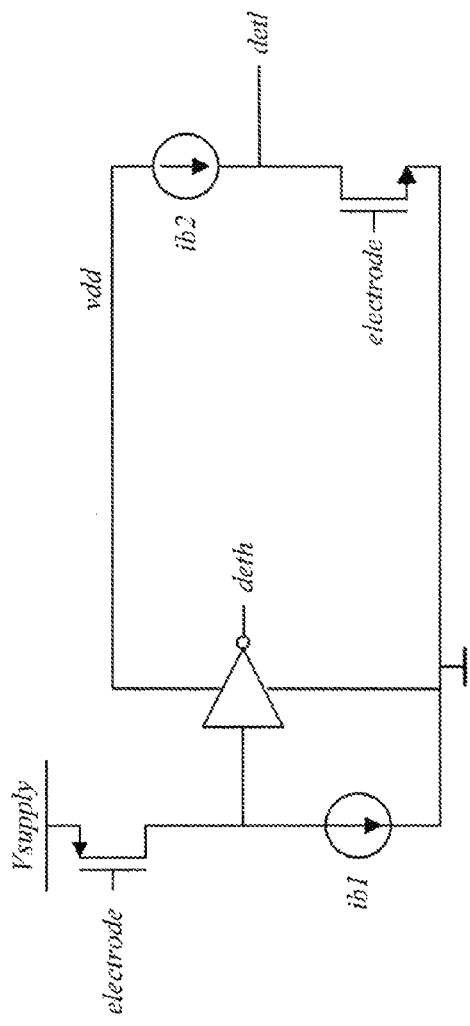
FIG. 7C shows a circuit that includes instances of both first detector DA100 and second detector DB100.

FIG. 7C shows a circuit that includes instances of both DA100 and DB100. In FIG. 7C, Vdd is a supply voltage to operate the logic gates, usually lower than Vsupply. The bias currents are in the nanoampere range, so that Vth and Vtl are determined by and substantially close to (e.g., within ten, twenty, or thirty percent of) the threshold voltages of the high-side and low-side transistors (e.g., QP10 and QN10), respectively. Typically all the transistors QP10 are implemented to have substantially the same threshold voltage (i.e., within process variations), and likewise typically all the transistors QN10 are implemented to have substantially the same threshold voltage (i.e., within process variations).

As a result, embodiments are simple and small, and use a low supply current. One or more (possibly all) of the high-side and/or low-side threshold detectors may be implemented instead as comparators having threshold voltages that are internal (e.g., an internal series or shunt voltage reference) or provided by a reference voltage generator. The embodiment circuit will trip when the electrode currents are still very accurate. It provides an early warning.

Figure 8A:
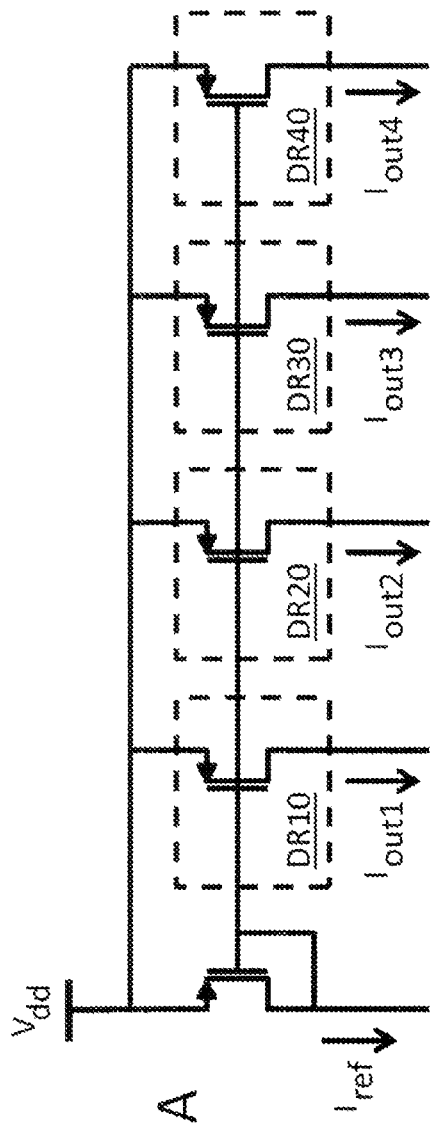
FIG. 8A shows a schematic diagram of an implementation of four detector current sources DR10-DR40.
Figure 8B:
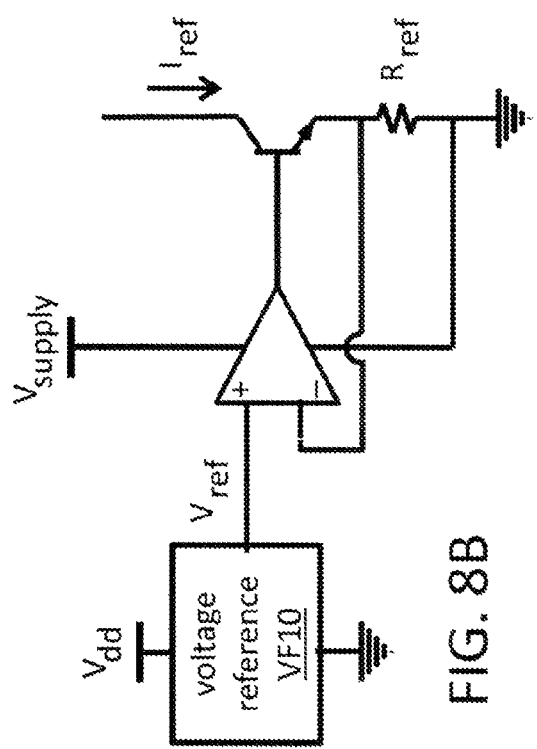
FIG. 8B shows a schematic diagram of one example of a current reference circuit.

The detector current sources DR10 and sinks DK10 may be implemented, for example, as respective output nodes of a current mirror having a small reference current at the input node. FIG. 8A shows a schematic diagram of such an implementation of four detector current sources DR10-DR40 for four corresponding instances of detector DB100. In this example, the output nodes may designed to be substantially identical to each other (i.e., within process tolerances) such that the corresponding output currents (Iout1 to Iout4) may be expected to be substantially identical to each other. FIG. 8B shows a schematic diagram of one example of a current reference circuit that may be used to generate a small bias current Iref. This circuit includes a voltage reference VF10 (e.g., a bandgap voltage reference) providing a reference voltage Vref (e.g., about 1.2 volts), a differential amplifier (e.g., an op-amp), a transistor, and an external resistor Rref having a resistance on the order of one megohm (e.g., 500K, 680K, 820K, 1M, 1.2M, 1.5M, 1.8M, 2.0M, 2.2M, 2.7M). The microampere-level reference current Iref across the resistor Rref may be applied to the input node of a current mirror as shown in FIG. 8A, and the detector current sources DR10-DR40 may be scaled according to the desired magnitude of Iout (e.g., one hundred nanoamperes). Implementation of instances of detector current sink DK10 according to the same principles (e.g., for corresponding instances of detector DA100) will be recognized by one of ordinary skill as fully disclosed herein.

Figure 9:
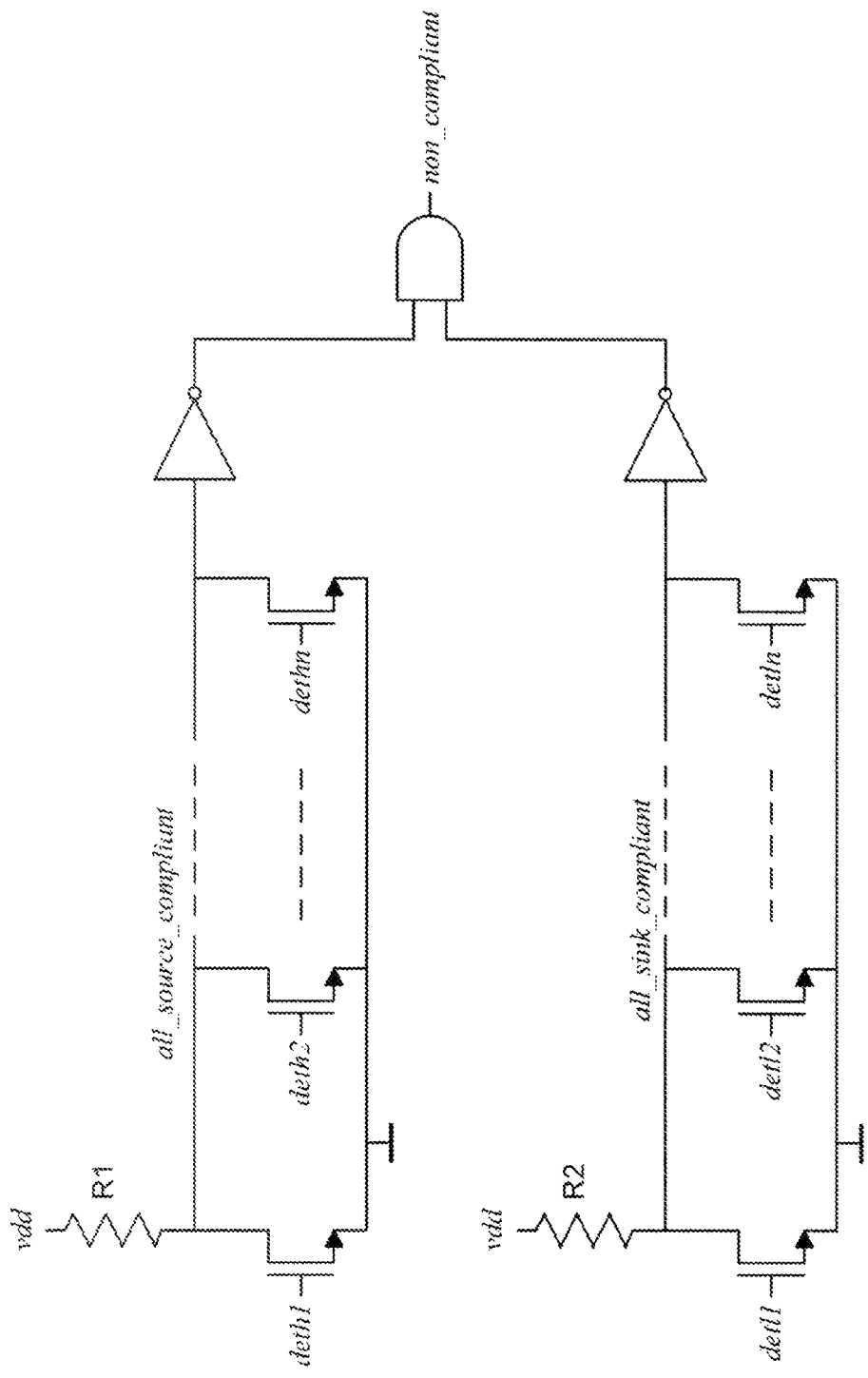
FIG. 9 shows a schematic diagram of an implementation of coincidence indicator CI10.
Figure 10:
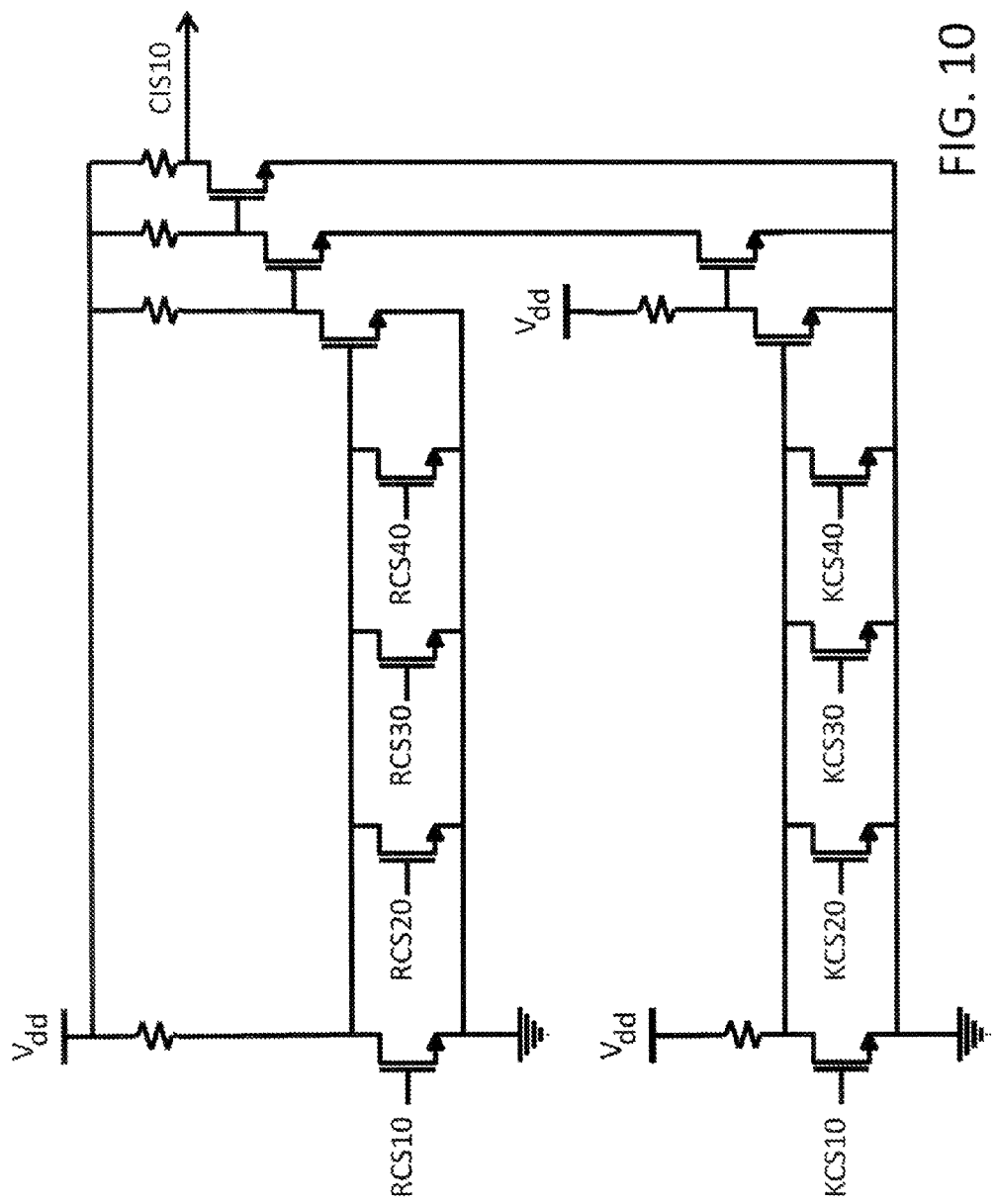
FIG. 10 shows an implementation of such a circuit in NMOS.

The detectors at the electrodes should be turned off when the electrode is not used (e.g., between pulses). For example, the bias currents in the corresponding detectors DA100 and DB100 may be interrupted at these times (e.g., by opening the gate-to-drain connection of the input node as shown in FIG. 8A and connecting the gate to the source instead). Alternatively or additionally, the source compliance signals RCS10 and sink compliance signals KCS10 may be tied to ground when the corresponding electrodes are inactive. As discussed above, an implementation of coincidence indicator CI10 as shown in FIG. 9 may be used to produce an output "non-compliant" that becomes high when at least one source and at least one sink are not compliant at the same time. FIG. 10 shows an implementation of such a circuit in NMOS, and implementation of such a logical operation in another logic family (e.g., CMOS) will be recognized by one of ordinary skill in the art as fully disclosed herein. Such an indication of non-compliance may be used as a control signal to increase Vsupply, to reduce the electrode drive currents, and/or to indicate the fault condition.

Figure 11A:
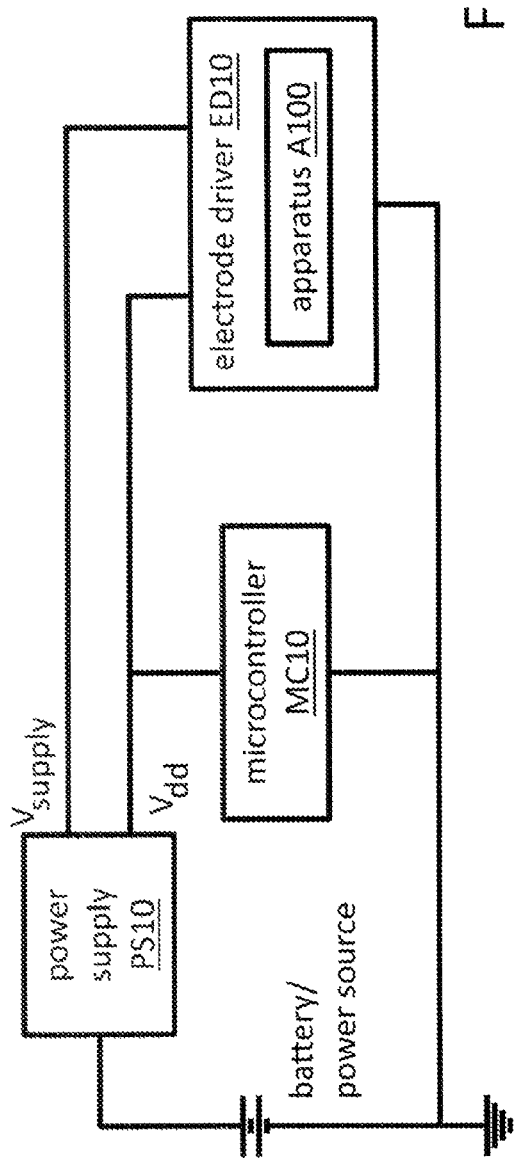
FIG. 11A shows a block diagram of an example of a tissue stimulator that includes an instance of apparatus A100.
Figure 11B:
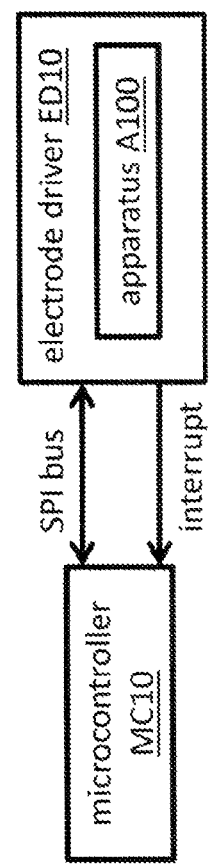
FIG. 11B illustrates communication between microcontroller MC10 and electrode driver ED10.

FIG. 11A shows a block diagram of an example of a tissue stimulator that includes a battery or other power source, a power supply PS10, a microcontroller MC 10, and an electrode driver ED10. These components are typically sealed hermetically into a package that is implanted into a patient as described above. Power supply PS10 is configured to convert the battery voltage into logic drive voltage Vdd (e.g., using a linear regulator) and electrode supply voltage Vsupply (e.g., using a boost converter). Electrode driver ED10 is typically implemented as an integrated circuit that receives Vdd and Vsupply and drives a plurality of implanted electrodes (not shown). Electrode driver ED10 includes an instance of apparatus A100 that is configured to monitor the electrode drive voltages as described herein. Microcontroller MC10 operates from voltage Vdd to control electrode driver ED10 by, for example, setting values that determine the timing, shape, and/or magnitudes of the current pulses. As shown in FIG. 11B, microcontroller MC10 may be configured to communicate such control values to electrode driver ED10 over a communication interface, such as a Serial Peripheral Interface (SPI) bus or an Inter-Integrated Circuit (I$^2$C) bus.

In one example as shown in FIG. 11B, apparatus A100 is arranged to provide coincidence indication signal CIS10 to microcontroller MC10 as an interrupt. Microcontroller MC10 may be configured to handle such an interrupt by, for example, controlling power supply PS10 to increase Vsupply, controlling electrode driver ED10 to reduce the electrode drive currents, and/or logging the fault condition.

Figure 12:
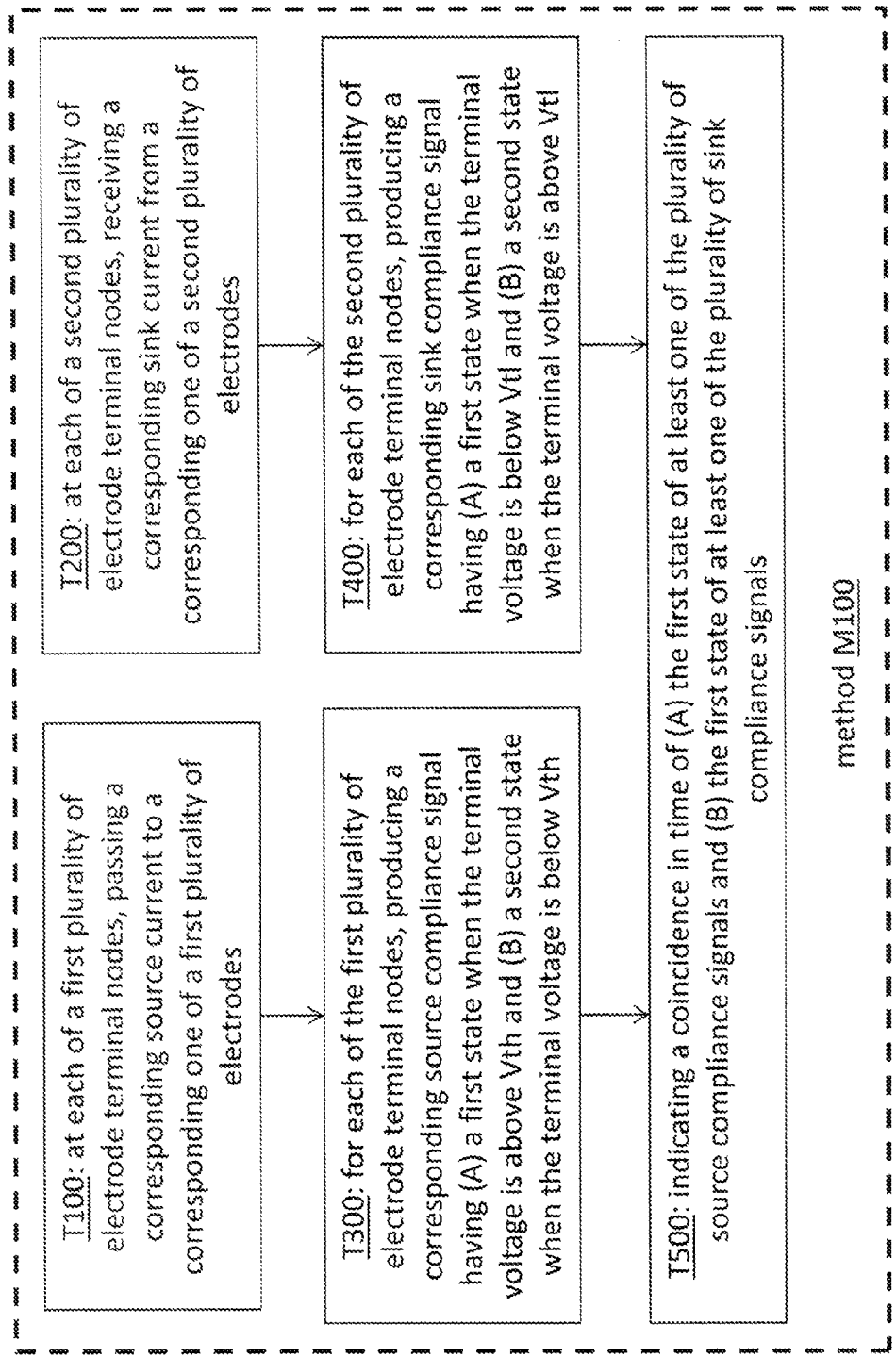
FIG. 12 shows a flowchart of a method of monitoring electrode drive voltages M100 according to a general configuration.

FIG. 12 shows a flowchart of a method of monitoring electrode drive voltages M100 according to a general configuration that includes tasks T100, T200, T300, T400, and T500. At each of a first plurality of electrode terminal nodes, task T100 passes a corresponding source current to a corresponding one of a first plurality of electrodes, and at each of a second plurality of electrode terminal nodes, task T200 receives a corresponding sink current from a corresponding one of a second plurality of electrodes (e.g., as described herein with reference to FIGS. 2A and 2B).

For each of the first plurality of electrode terminal nodes, task T300 produces a corresponding source compliance signal having (A) a first state when a voltage at the electrode terminal node is above Vth and (B) a second state different than the first state when the voltage at the electrode terminal node is below Vth (e.g., as described herein with reference to detectors DA10, DA20). For each of the second plurality of electrode terminal nodes, task T400 produces a corresponding sink compliance signal having (A) a first state when a voltage at the electrode terminal node is below Vtl and (B) a second state different than the first state when the voltage at the electrode terminal node is above Vtl (e.g., as described herein with reference to detectors DB10, DB20). Task T500 indicates a coincidence in time of (A) the first state of at least one of the plurality of source compliance signals and (B) the first state of at least one of the plurality of sink compliance signals (e.g., as described herein with reference to coincidence indicator CI10).

Figure 13:
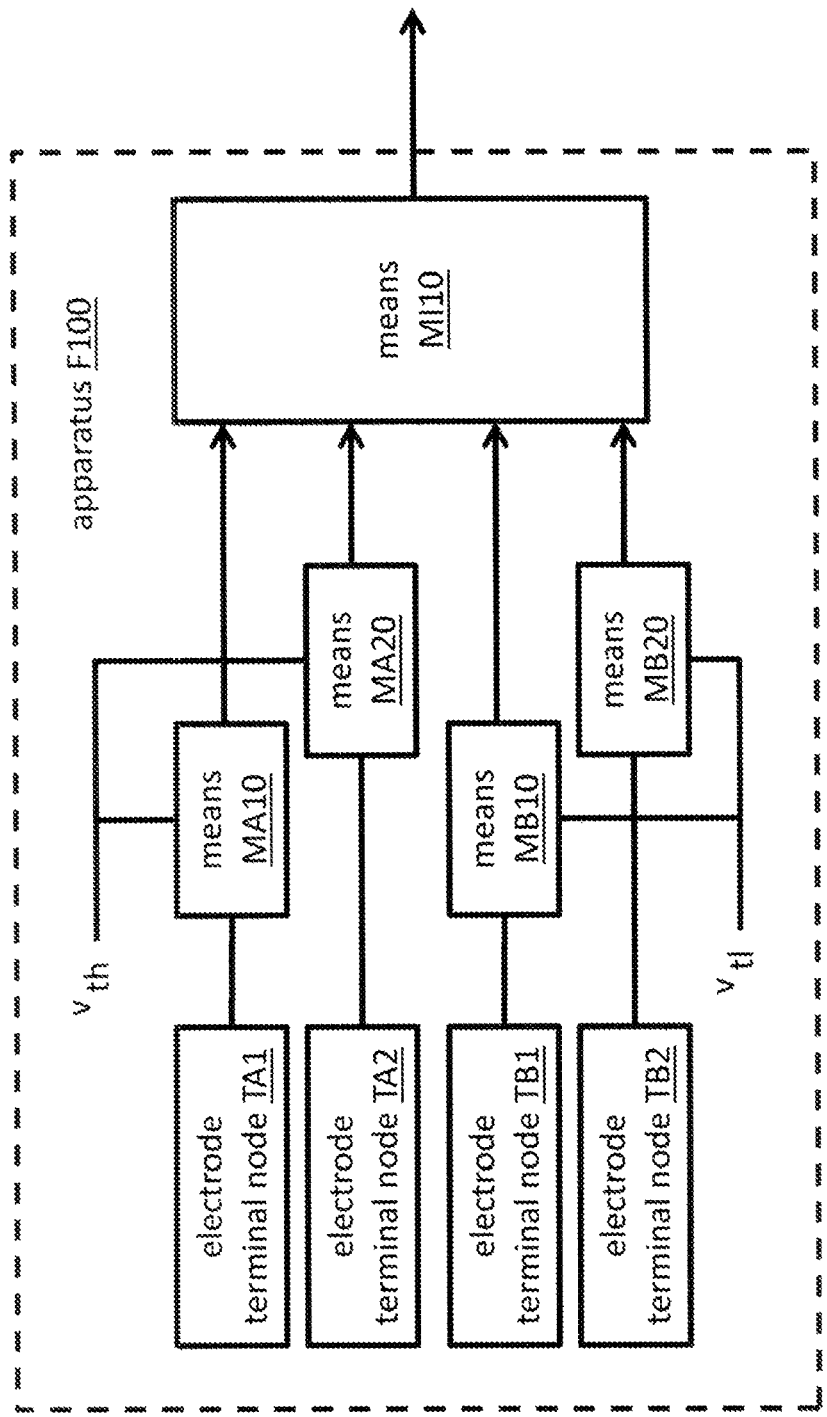
FIG. 13 shows a block diagram of an apparatus for monitoring electrode drive voltages F100 according to a general configuration.

FIG. 13 shows a block diagram of an apparatus for monitoring electrode drive voltages F100 according to a general configuration. Apparatus F100 includes a first plurality of electrode terminal nodes TA1 and TA2 and a second plurality of electrode terminal nodes TB1 and TB2 as described herein. Apparatus F100 also includes a plurality of first detecting means MA10 and MA20 and a plurality of second detecting means MB10 and MB20. Each first detecting means (e.g., MA10, MA20) is configured to produce a corresponding source compliance signal having (A) a first state when a voltage at a corresponding one of the first plurality of electrode terminals is above the high-side threshold voltage Vth and (B) a second state different than the first state when the voltage at the corresponding one of the first plurality of electrode terminals is below Vth (e.g., as described herein with reference to threshold detectors DA10, DA20). Each second detecting means (e.g., MB10, MB20) is configured to produce a corresponding sink compliance signal having (A) a first state when a voltage at a corresponding one of the second plurality of electrode terminals is below the low-side threshold voltage Vtl and (B) a second state different than the first state when the voltage at the corresponding one of the second plurality of electrode terminals is above Vtl (e.g., as described herein with reference to threshold detectors DB10, DB20).

Apparatus F100 also includes means for indicating MI10 that is configured to indicate a coincidence in time of (A) the first state of at least one of the plurality of source compliance signals and (B) the first state of at least one of the plurality of sink compliance signals (e.g., as described herein with reference to coincidence indicator CI10). One of ordinary skill will recognize that the architecture of apparatus F100 may be extended in the same manner to monitor an arbitrary number of sourcing electrode terminal nodes and an arbitrary number of sinking electrode terminal nodes.

Figure 14:
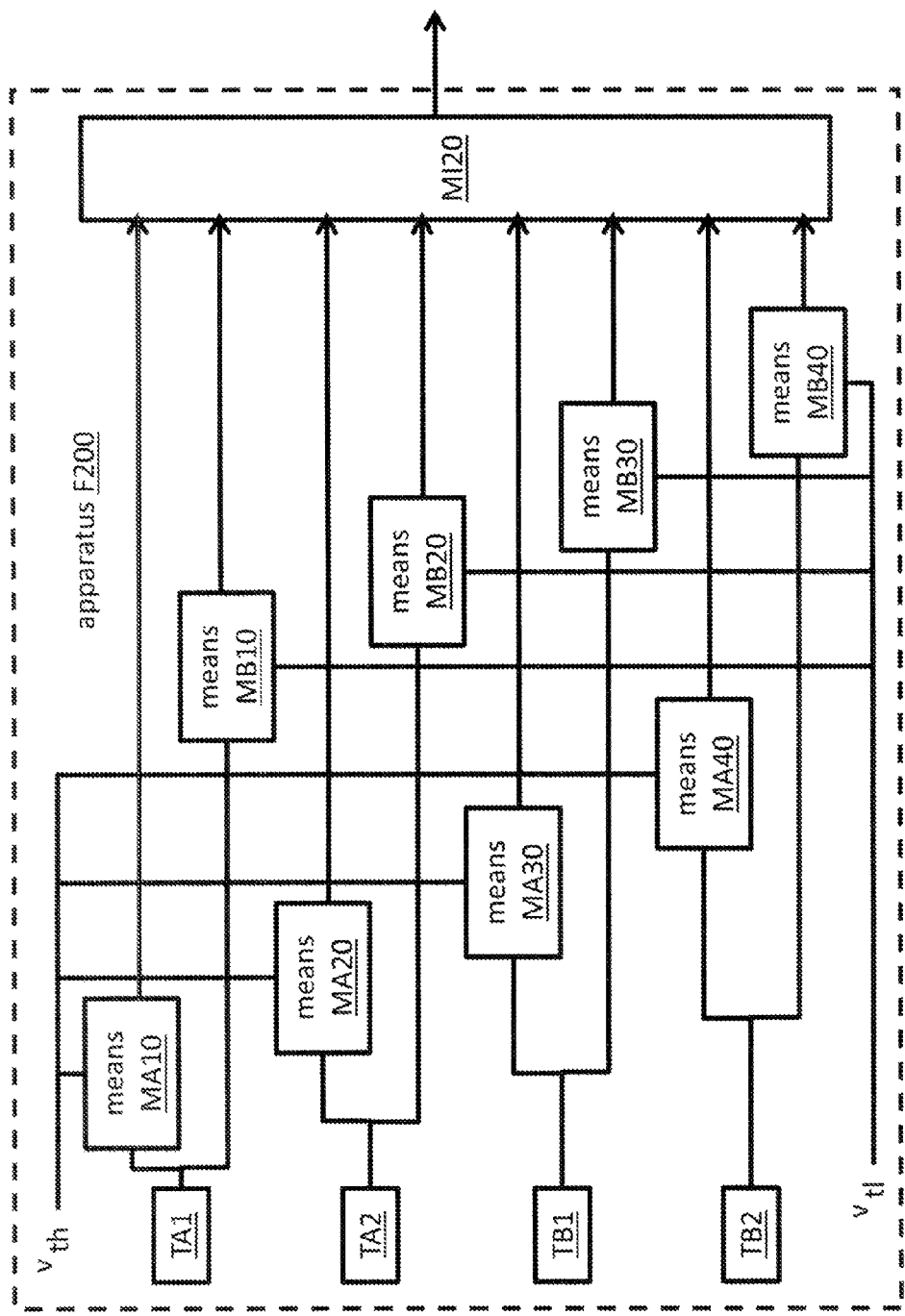
FIG. 14 shows a block diagram of an implementation F200 of apparatus F100.

As noted above, it may be desired to monitor the voltage at each electrode terminal for both high-side and low-side compliance. FIG. 14 shows a block diagram of such an implementation F200 of apparatus F100 that includes an instance of each of detecting means MA10 (i.e., means MA10, MA20, MA30, and MA40) and MB10 (i.e., means MB10, MB20, MB30, and MB40) for each of the electrode terminal nodes. Apparatus F200 also includes an implementation MI20 of indicating means MI10 that indicates a coincidence in time of (A) the first state of at least one of the plurality of source compliance signals and (B) the first state of at least one of the plurality of sink compliance signals (e.g., as described herein with reference to coincidence indicator CI20). One of ordinary skill will recognize that the architecture of apparatus F200 may be extended to monitor an arbitrary number of electrode terminal nodes in the same manner.

The previous description of the embodiments is provided to enable any person skilled in the art to practice the disclosure. The various modifications to these embodiments will be readily apparent to those skilled in the art, and the generic principles defined herein may be applied to other embodiments without the use of inventive faculty. Unless indicated otherwise, any disclosure of an operation of an apparatus having a particular feature is also expressly intended to disclose a method having an analogous feature (and vice versa), and any disclosure of an operation of an apparatus according to a particular configuration is also expressly intended to disclose a method according to an analogous configuration (and vice versa). Thus, the present disclosure is not intended to be limited to the embodiments shown herein, but is to be accorded the widest scope consistent with the principles and novel features disclosed herein.

What is claimed is:

1. An apparatus for monitoring electrode drive voltages, said apparatus comprising:
   a first plurality of electrode terminal nodes, each configured to pass a corresponding source current to a corresponding one of a first plurality of electrodes;
   a plurality of first threshold detectors, each configured to produce a corresponding source compliance signal having (A) a first state when a voltage at a corresponding one of the first plurality of electrode terminal nodes is above a high-side threshold voltage and (B) a second state different than the first state when the voltage at the corresponding one of the first plurality of electrode terminal nodes is below the high-side threshold voltage;
   a second plurality of electrode terminal nodes, each configured to receive a corresponding sink current from a corresponding one of a second plurality of electrodes;
   a plurality of second threshold detectors, each configured to produce a corresponding sink compliance signal having (A) a first state when a voltage at a corresponding one of the second plurality of electrode terminal nodes is below a low-side threshold voltage and (B) a second state different than the first state when the voltage at the corresponding one of the second plurality of electrode terminal nodes is above the low-side threshold voltage; and
   a coincidence indicator configured to indicate a coincidence in time of (A) the first state of at least one of the plurality of source compliance signals and (B) the first state of at least one of the plurality of sink compliance signals,
   wherein said low-side threshold voltage is between said high-side threshold voltage and a lowest potential of the apparatus.

2. The apparatus according to claim 1, said apparatus further comprising an output current source configured to receive power at a supply voltage and to source, to at least one of the first plurality of electrode terminal nodes, said corresponding source current,
   wherein said high-side threshold voltage is between said supply voltage and said lowest potential.

3. The apparatus according to claim 2, wherein a difference between said high-side threshold voltage and said supply voltage is not more than one volt.

4. The apparatus according to claim 2, said apparatus further comprising an output current sink configured to receive power at the supply voltage and to draw, from at least one of the second plurality of electrode terminal nodes, said corresponding sink current,
   wherein said low-side threshold voltage is between said high-side threshold voltage and said lowest potential.

5. The apparatus according to claim 4, wherein a difference between said low-side threshold voltage and said lowest potential is not more than one volt.

6. The apparatus according to claim 1, wherein each of said plurality of first threshold detectors comprises a corresponding one of a corresponding first plurality of transistors, and
   wherein, for each of said plurality of first threshold detectors, said corresponding transistor has a gate conductively coupled to the corresponding electrode terminal node, a source conductively coupled to the supply voltage, and a drain conductively coupled to a current sink, wherein said corresponding source compliance signal is based on a voltage at said drain.

7. The apparatus according to claim 6, wherein each of said plurality of second threshold detectors comprises a corresponding one of a corresponding second plurality of transistors, and
wherein, for each of said plurality of second threshold detectors, said corresponding transistor has a gate conductively coupled to the corresponding electrode terminal, a source conductively coupled to said lowest potential, and a drain conductively coupled to a current source, wherein said corresponding sink compliance signal is based on a voltage at said drain.

8. The apparatus according to claim 1, wherein each of said plurality of first threshold detectors comprises a corresponding one of a first plurality of transistors, said high-side threshold voltage being determined by a threshold voltage of the transistor.

9. The apparatus according to claim 1, wherein said apparatus further comprises:
a second plurality of second threshold detectors, each configured to produce a corresponding sink compliance signal having (A) a first state when a voltage at a corresponding one of the first plurality of electrode terminal nodes is below a low-side threshold voltage and (B) a second state different than the first state when the voltage at the corresponding one of the first plurality of electrode terminal nodes is above the low-side threshold voltage; and
a second plurality of first threshold detectors, each configured to produce a corresponding source compliance signal having (A) a first state when a voltage at a corresponding one of the second plurality of electrode terminal nodes is above a high-side threshold voltage and (B) a second state different than the first state when the voltage at the corresponding one of the second plurality of electrode terminal nodes is below the high-side threshold voltage.

10. A method of monitoring electrode drive voltages in a circuit, said method comprising:
at each of a first plurality of electrode terminal nodes, passing a corresponding source current to a corresponding one of a first plurality of electrodes;
for each of the first plurality of electrode terminal nodes, producing a corresponding source compliance signal having (A) a first state when a voltage at said electrode terminal node is above a high-side threshold voltage and (B) a second state different than the first state when the voltage at said electrode terminal node is below the high-side threshold voltage;
at each of a second plurality of electrode terminal nodes, receiving a corresponding sink current from a corresponding one of a second plurality of electrodes;
for each of the second plurality of electrode terminal nodes, producing a corresponding sink compliance signal having (A) a first state when a voltage at said electrode terminal node is below a low-side threshold voltage and (B) a second state different than the first state when the voltage at said electrode terminal node is above the low-side threshold voltage; and
indicating a coincidence in time of (A) the first state of at least one of the plurality of source compliance signals and (B) the first state of at least one of the plurality of sink compliance signals,
wherein said low-side threshold voltage is between said high-side threshold voltage and a lowest potential of the circuit.

11. The method according to claim 10, said method further comprising feeding an output current source at a supply voltage to source said sourced current to at least one of the first plurality of electrode terminal nodes,
wherein said high-side threshold voltage is between said supply voltage and said lowest potential.

12. The method according to claim 11, wherein a difference between said high-side threshold voltage and said supply voltage is not more than one volt.

13. The method according to claim 11, said method further comprising feeding an output current sink at the supply voltage to draw, from at least one of the second plurality of electrode terminal nodes, said corresponding sink current,
wherein said low-side threshold voltage is between said high-side threshold voltage and said lowest potential.

14. The method according to claim 13, wherein a difference between said low-side threshold voltage and said lowest potential is not more than one volt.

15. The method according to claim 10, wherein, for each of the first plurality of electrode terminal nodes, said corresponding source compliance signal is based on a voltage at a drain of a corresponding transistor that has a gate conductively coupled to the corresponding electrode terminal node and a source conductively coupled to the supply voltage, wherein said drain is conductively coupled to a current sink.

16. The method according to claim 15, wherein, for each of the second plurality of electrode terminal nodes, said corresponding sink compliance signal is based on a voltage at a drain of a corresponding transistor that has a gate conductively coupled to the corresponding electrode terminal node and a source conductively coupled to said lowest potential, wherein said drain is conductively coupled to a current source.

17. The method according to claim 10, wherein, for each of the first plurality of electrode terminal nodes, said high-side threshold voltage is determined by a threshold voltage of a corresponding one of a first plurality of transistors.

18. The method according to claim 10, wherein said passing the corresponding source current at each of the first plurality of electrode terminal nodes and said producing a corresponding source compliance signal for each of the first plurality of electrode terminal nodes occurs during a first time interval, and
wherein said method comprises:
during a second time interval that is separate from the first time interval, at each of the first plurality of electrode terminal nodes, receiving a corresponding sink current from the corresponding one of the first plurality of electrodes; and
during the second time interval, for each of the first plurality of electrode terminal nodes, producing a corresponding sink compliance signal having (A) a first state when a voltage at said electrode terminal node is below the low-side threshold voltage and (B) a second state different than the first state when the voltage at said electrode terminal node is above the low-side threshold voltage.

19. An apparatus for monitoring electrode drive voltages, said apparatus comprising:
a first plurality of electrode terminal nodes, each configured to pass a corresponding source current to a corresponding one of a first plurality of electrodes;
a plurality of first detecting means, each for producing a corresponding source compliance signal having (A) a first state when a voltage at a corresponding one of the first plurality of electrode terminal nodes is above a high-side threshold voltage and (B) a second state different than the first state when the voltage at the corresponding one of the first plurality of electrode terminal nodes is below the high-side threshold voltage;

a second plurality of electrode terminal nodes, each configured to receive a corresponding sink current from a corresponding one of a second plurality of electrodes;

a plurality of second detecting means, each for producing a corresponding sink compliance signal having (A) a first state when a voltage at a corresponding one of the second plurality of electrode terminal nodes is below a low-side threshold voltage and (B) a second state different than the first state when the voltage at the corresponding one of the second plurality of electrode terminal nodes is above the low-side threshold voltage; and means for indicating a coincidence in time of (A) the first state of at least one of the plurality of source compliance signals and (B) the first state of at least one of the plurality of sink compliance signals, wherein said low-side threshold voltage is between said high-side threshold voltage and a lowest potential of the apparatus.

20. The apparatus according to claim 19, wherein each of said plurality of first detecting means comprises a corresponding one of a first plurality of transistors, said high-side threshold voltage being determined by a threshold voltage of the transistor.

* * * * *